(12) United States Patent
Sawabe et al.

(10) Patent No.: US 10,553,443 B2
(45) Date of Patent: Feb. 4, 2020

(54) PATTERN FORMATION METHOD

(71) Applicant: Toshiba Memory Corporation, Tokyo (JP)

(72) Inventors: Tomoaki Sawabe, Tokyo (JP); Shinobu Sugimura, Kanagawa (JP); Koji Asakawa, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 45 days.

(21) Appl. No.: 15/703,127

(22) Filed: Sep. 13, 2017

(65) Prior Publication Data

US 2018/0138048 A1 May 17, 2018

(30) Foreign Application Priority Data

Nov. 16, 2016 (JP) ................. 2016-223082

(51) Int. Cl.
*B81C 1/00* (2006.01)
*G03F 7/00* (2006.01)
*H01L 21/027* (2006.01)
*H01L 21/033* (2006.01)
*H01L 21/308* (2006.01)
*H01L 51/00* (2006.01)

(52) U.S. Cl.
CPC ........ *H01L 21/3081* (2013.01); *B81C 1/0046* (2013.01); *B81C 1/00436* (2013.01); *G03F 7/0002* (2013.01); *H01L 21/0271* (2013.01); *H01L 21/0273* (2013.01); *H01L 21/033* (2013.01); *H01L 51/0043* (2013.01)

(58) Field of Classification Search
None
See application file for complete search history.

(56) References Cited

U.S. PATENT DOCUMENTS

| 8,900,467 | B1 | 12/2014 | Chapuis et al. |
| 8,980,418 | B2 | 3/2015 | Darling et al. |
| 9,416,447 | B2 | 8/2016 | Arora et al. |
| 2011/0059299 | A1* | 3/2011 | Kim ............. B81C 1/00031 428/195.1 |

(Continued)

FOREIGN PATENT DOCUMENTS

| JP | 2011-159904 | 8/2011 |
| JP | 2013-179218 | 9/2013 |

*Primary Examiner* — Stephanie P Duclair
(74) *Attorney, Agent, or Firm* — Finnegan, Henderson, Farabow, Garrett & Dunner, L.L.P.

(57) ABSTRACT

According to one embodiment, a pattern formation method includes forming a structure body on a first surface of a patterning member, the structure body having protrusions and a recess. The protrusions are arranged at a first pitch along a first direction. The first direction is aligned with the first surface. The recess is between the protrusions. The method further includes forming a resin film of a block copolymer on the structure body. The block copolymer includes first portions and second portions. The first and second portions are arranged alternately at a second pitch along the first direction. The structure body includes first and second regions. The first portions are on the first regions. The second portions on the second regions. The method further includes removing the second portions and the second regions, introducing a metal to the first regions, and etching the patterning member using the first regions.

19 Claims, 3 Drawing Sheets

(56) References Cited

U.S. PATENT DOCUMENTS

| | | | |
|---|---|---|---|
| 2012/0241411 A1* | 9/2012 | Darling | G03F 7/405 216/67 |
| 2013/0183828 A1* | 7/2013 | Nakamura | G03F 7/40 438/694 |
| 2013/0319850 A1* | 12/2013 | Hirano | G11B 5/855 204/192.34 |
| 2014/0193754 A1* | 7/2014 | Wu | C08F 293/00 430/296 |
| 2015/0262606 A1* | 9/2015 | Xiao | G11B 5/855 428/210 |
| 2016/0244557 A1 | 8/2016 | Vora et al. | |

* cited by examiner

PATTERN FORMATION METHOD

CROSS-REFERENCE TO RELATED APPLICATIONS

This application is based upon and claims the benefit of priority from Japanese Patent Application No. 2016-223082, filed on Nov. 16, 2016; the entire contents of which are incorporated herein by reference.

FIELD

Embodiments described herein relate generally to a pattern formation method.

BACKGROUND

For example, a fine pattern is formed in the manufacture of an electronic device such as a semiconductor device, etc. High precision is desirable in the pattern formation method.

DETAILED DESCRIPTION

Figure 1:
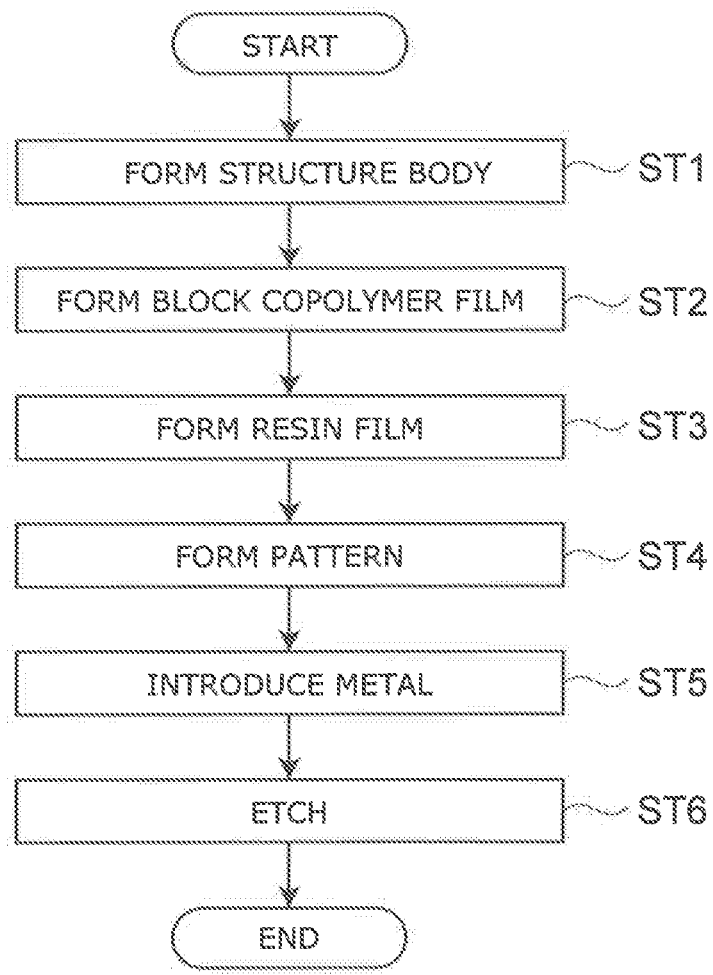
FIG. 1 is a flowchart illustrating a pattern formation method according to an embodiment.

According to one embodiment, a pattern formation method includes forming a structure body on a first surface of a patterning member, the structure body having a plurality of protrusions and a recess. The protrusions are arranged at a first pitch along a first direction. The first direction is aligned with the first surface. The recess is between the protrusions. The method further includes forming a resin film of a block copolymer on the structure body. The block copolymer includes a plurality of first portions and a plurality of second portions. The first portions and the second portions are arranged alternately at a second pitch along the first direction. The structure body includes a plurality of first regions and a plurality of second regions. The first portions are on the first regions. The second portions on the second regions. The method further includes removing the second portions and the second regions, introducing a metal to the first regions after the removing, and etching the patterning member using the first regions after the introducing.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

Embodiment

FIG. 1 is a flowchart illustrating a pattern formation method according to an embodiment.

FIG. 2A to FIG. 2I are schematic cross-sectional views in order of the processes, illustrating the pattern formation method according to the embodiment.

As shown in FIG. 1, a structure body 2 is formed on a first surface 1a of a patterning member 1 (step ST1).

The patterning member 1 is, for example, a quartz substrate. The patterning member 1 may be, for example, a semiconductor wafer (e.g., a silicon wafer), etc. The method for forming the structure body 2 is arbitrary. In the example, the structure body 2 is formed by imprinting (imprint lithography).

Figure 2A:
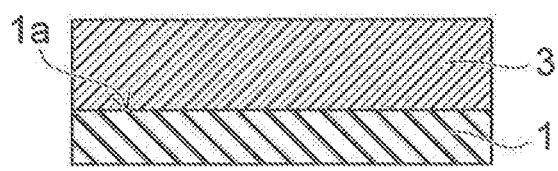
FIG. 2A to FIG. 2I are schematic cross-sectional views in order of the processes, illustrating the pattern formation method according to the embodiment.

For example, as shown in FIG. 2A, a resin material film 3 is formed on the patterning member 1 by coating a resin material on the patterning member 1. In the example, the resin material is a NIL resist used in nanoimprint lithography (NIL).

Figure 2E:
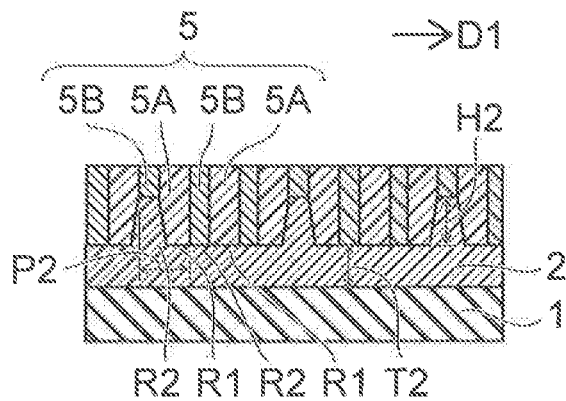
Figure 2B:
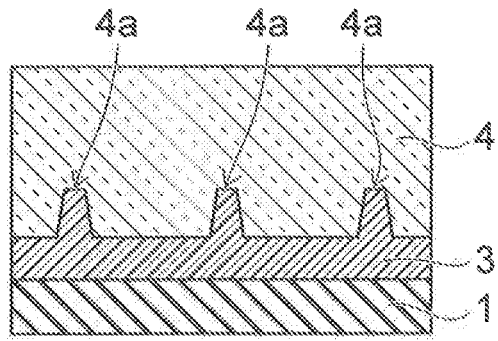

As shown in FIG. 2B, a template 4 is caused to contact the resin material film 3. The template 4 has multiple recesses 4a. In this state, the resin material film 3 is cured by, for example, irradiating light (e.g., ultraviolet) via the template 4. The resin material film 3 may be cured by heating. After the curing, the template 4 is separated from the resin material film 3.

Figure 2F:
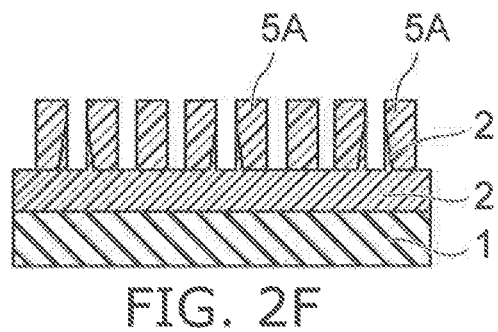
Figure 2C:
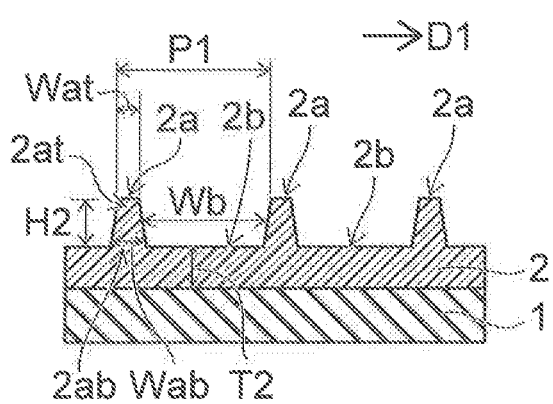

Thereby, as shown in FIG. 2C, the structure body 2 is obtained from the resin material film 3. The structure body 2 is formed on the first surface 1a of the patterning member 1.

The structure body 2 has multiple protrusions 2a and a recess 2b. The multiple protrusions 2a correspond to the multiple recesses 4a of the template 4. The recess 2b corresponds to a protrusion of the template.

The multiple protrusions 2a are arranged at a first pitch P1 along a first direction D1. The first direction D1 is aligned with the first surface 1a. In the embodiment, each (one) of the multiple protrusions 2a has a height H2. The recess 2b has a thickness T2.

In the example, each of the multiple protrusions 2a becomes finer from the patterning member 1 side toward the tip of the protrusion 2a. For example, one of the multiple protrusions 2a Includes a top portion 2at and a bottom portion 2ab. The bottom portion 2ab is positioned between the top portion 2at and the patterning member 1. A width Wat along the first direction D1 of the top portion 2at is finer than a width Wab along the first direction D1 of the bottom portion 2ab. Due to such a configuration, for example, the template 4 is easily separated from the resin material film 3.

A width Wb along the first direction D1 of the recess 2b is wider than the width Wat along the first direction D1 of the top portion 2at. For example, the width Wb along the first direction D1 of the recess 2b may be wider than the width Wab along the first direction D1 of the bottom portion 2ab. For example, the width Wb along the first direction D1 of the recess 2b may be larger than the average of the width Wat and the width Wab recited above. The width along the first direction D1 of one of the protrusions 2a is the average of the width Wat recited above and the width Wab recited above.

Subsequently, a resin film is formed on the structure body 2. The resin film is formed from a film of a block copolymer.

For example, as shown in FIG. 1, a block copolymer film 5F is formed on the structure body 2 (step ST2).

Figure 2G:
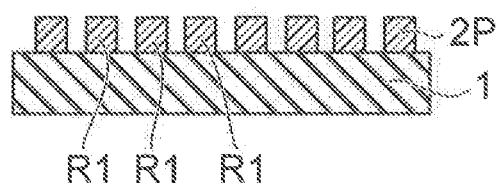
Figure 2H:
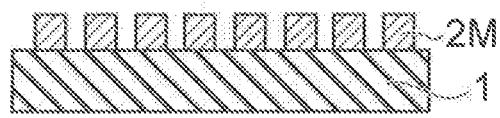
Figure 2D:
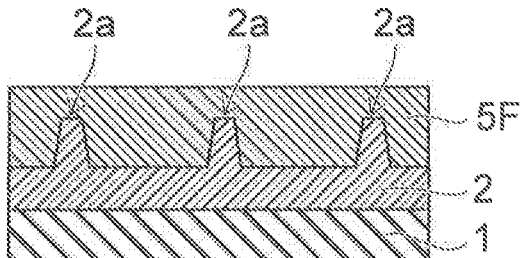

For example, as shown in FIG. 2D, the block copolymer is coated onto the structure body 2. Thereby; the block copolymer film 5F is formed. The coating includes, for example, implementing at least one of spin coating, drop casting, or inkjet. As described below, the block copolymer includes first portions and second portions. For example, the multiple first portions include styrene; and the multiple second portions include acrylic. For example, the first portions include polystyrene (PS). For example, the second portions include polymethyl methacrylate (PMMA).

A resin film is formed as shown in FIG. 1 (step ST3). The resin film is, for example, a self-assembly film.

For example, as shown in FIG. 2E, heat treatment of the block copolymer film 5F formed on the structure body 2 is performed. The temperature of the heat treatment is, for example, higher than the glass transition temperature of first portions 5A (e.g., PS) and higher than the glass transition temperature of second portions 5B (e.g., PMMA). Self assembly occurs in the block copolymer film 5F. Phase separation occurs. Thereby, a resin film 5 is obtained. The resin film 5 includes the multiple first portions 5A and the multiple second portions 5B. In the example, the first portions 5A are the PS phase. The second portions 5B are the PMMA phase.

Thus, the resin film 5 of the block copolymer including the multiple first portions 5A and the multiple second portions 5B is formed on the structure body 2. The multiple first portions 5A and the multiple second portions 5B are arranged alternately at a second pitch P2 along the first direction D1. The structure body 2 includes multiple first regions R1 and multiple second regions R2. The first regions R1 are positioned under the multiple first portions 5A. The multiple second regions R2 are positioned under the multiple second portions 5B. The multiple first portions 5A are on the multiple first regions R1. The multiple second portions 5B are on the multiple second regions R2. The multiple first regions R1 and the multiple second regions R2 are arranged at the first pitch P1 along the first direction D1. The structure body 2 functions as, for example, a physical guide for the self assembly.

For example, one of the multiple second portions 5B of the resin film 5 is positioned on one of the multiple protrusions 2a of the structure body 2. The multiple first portions 5A and the multiple second portions 5B are arranged alternately on the recess 2b of the structure body 2.

For example, the first pitch P1 is, for example, an integer multiple of the second pitch P2. In the example shown in FIG. 2E, the first pitch P1 is 3 times the second pitch P2. The first pitch P1 is, for example, an integer multiple of two or more of the second pitch P2. For example, the multiple protrusions 2a of the structure body 2 are formed at a large first pitch P1. In the resin film 5, the first portions 5A and the second portions 5B are arranged at the second pitch P2 that is smaller than the first pitch P1. Thereby, the fine pattern is obtained with high precision.

Subsequently, the multiple second portions 5B and the multiple second regions R2 under the multiple second portions 5B are removed.

In other words, as shown in FIG. 1, a pattern 2P that is made of the structure body 2 is formed on the patterning member 1 (step ST4).

For example, as shown in FIG. 2F, the structure body 2 and the resin film 5 (the self-assembled block copolymer film) are etched in, for example, an atmosphere of a first gas (e.g., dry etching including oxygen). For example, the etching rate of the second portions 5B (e.g., PMMA) is higher than the etching rate of the first portions 5A (e.g., PS). Therefore, the second portions 5B are removed; and the first portions 5A remain. In the example, under the atmosphere of the first gas, the etching rate of the structure body 2 is higher than the etching rate of the first portions 5A. The protrusions 2a also are etched together with the second portions 5B.

The etching in the atmosphere of the first gas is continued further. As a result, as shown in FIG. 2G, the first regions R1 (the portions positioned under the first portions 5A) of the structure body 2 remain on the patterning member 1. Thus, the pattern 2P that is made of the structure body 2 is formed on the patterning member 1. The pattern 2P includes the multiple first regions R1.

As shown in FIG. 1, a metal is introduced to the remaining first regions R1 (step ST5). For example, metalization (e.g., sequential infiltration synthesis) is performed.

For example, as shown in FIG. 2H, for example, sequential infiltration synthesis is used to introduce the metal. In the sequential infiltration synthesis, the pattern 2P (the multiple first regions R1) is processed inside a metal complex atmosphere (e.g., an organometallic complex atmosphere). Thereby, the metal is incorporated into the pattern 2P. At least one metal selected from the group consisting of aluminum (Al), zinc (Zn), titanium (Ti), and tungsten (W) is used in the sequential infiltration synthesis. For example, the multiple first regions R1 are processed in an atmosphere of a metal complex including Al (e.g., trimethyl aluminum (TMA)). Thereby, the pattern 2P becomes a pattern 2M including aluminum. For example, the metal may be oxidized by exposing the multiple first regions R1 including the metal to a water vapor atmosphere.

As shown in FIG. 1, the patterning member 1 is etched using, as a mask, the multiple first regions R1 (the pattern 2M) into which the metal is introduced (step ST6).

Figure 2I:

For example, as shown in FIG. 2I, the patterning member 1 is etched using the pattern 2M as a mask in, for example, a dry etching atmosphere including a second gas (e.g., carbon tetrafluoride ($CF_4$)). Thereby, a pattern that has multiple recesses 1b is formed in the first surface 1a of the patterning member 1.

In the embodiment, the metal is introduced to the pattern 2P after forming the pattern 2P (the remaining multiple first regions R1). The pattern 2M is obtained from the pattern 2P by introducing the metal. The stability of the configuration of the pattern 2M is higher than the stability of the configuration of the pattern 2P. Collapse of the pattern 2M is suppressed. The high-precision pattern is obtained by patterning the patterning member 1 using the pattern 2M.

On the other hand, for example, a reference example may be considered in which the metal is introduced to the structure body 2 in the state of FIG. 2C. In such a case, the configuration of the structure body 2 is stabilized by introducing the metal. In the reference example, such a structure body 2 is patterned using the multiple first portions 5A of the resin film as a mask. The structure body 2 is difficult to pattern because the metal is introduced. Therefore, it is difficult to sufficiently increase the precision of the pattern 2P.

Conversely, in the embodiment, the pattern 2P is formed prior to the introduction of the metal. Thereby, the pattern 2P can be obtained with high precision. The precision of the pattern substantially does not change when introducing the metal. In the pattern 2M that is obtained, the configuration is stable; and the collapse is suppressed. By using such a pattern 2M, the patterning member 1 can be patterned with high precision.

In the embodiment, for example, the pattern 2P is formed using the resin film 5. As a result, the fine pattern can be formed in, for example, the patterning member 1.

For example, self assembly that uses the structure body 2 is performed to form the resin film 5. Therefore, for example, the phase that is etched easily (e.g., the second portions 5B) and the phase that is difficult to etch (e.g., the first portions 5A) can be caused to occur with high precision.

For example, imprint lithography is used to form the structure body 2. The structure body 2 can be formed relatively easily.

In the embodiment, it is favorable for the height H2 of the multiple protrusions 2a to be greater than 0.5 times the second pitch P2. Thereby, a self-assembled arrangement is possible in a direction along the structure body 2.

In the embodiment, for example, it is favorable for the thickness T2 of the recess 2b to be thicker than ½ of the second pitch P2 and thinner than 3 times ½ of the second pitch P2. Thereby, for example, the collapse of the pattern 2P can be suppressed.

In the embodiment, the second pitch P2 is, for example, not less than 10 nm and not more than 100 nm. The height H2 of the multiple protrusions 2a is, for example, 5 nm or more. The thickness T2 of the recess 2b is not less than 5 nm and not more than 100 nm.

In the embodiment, the structure body 2 includes, for example, at least one selected from the group consisting of an acrylic group, a ketone group, and an amino group.

For example, the difference between the surface energy of the structure body 2 and the surface energy of the second portions 5B is smaller than the difference between the surface energy of the second portions 5B and the surface energy of the first portions 5A.

Figure 3:
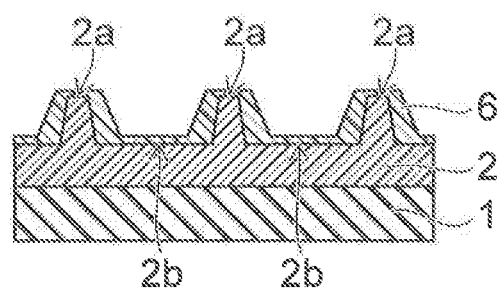
FIG. 3 is a schematic cross-sectional view illustrating a portion of another pattern formation method according to the embodiment.

FIG. 3 is a schematic cross-sectional view illustrating a portion of another pattern formation method according to the embodiment.

As shown in FIG. 3, an neutralization film 6 is formed on the structure body 2 after forming the structure body 2 and prior to forming the resin film 5. Otherwise, the processing is similar to the processing described in reference to FIG. 2A to FIG. 2B.

For example, the surface energy of the neutralization film 6 is between the surface energy of the multiple first portions 5A and the surface energy of the multiple second portions 5B.

The formation of the neutralization film 6 includes, for example, performing neutralization processing of the surface of the structure body 2. For example, the neutralization film 6 is formed at the surface of the structure body 2 by the neutralization processing.

For example, the neutralization processing causes the surface energy of the structure body 2 to be between the surface energy of the first portions 5A and the surface energy of the second portions 5B. Thereby, for example, the self assembly of the block copolymer film 5F is performed more reliably in the process of the self assembly of the block copolymer film 5F shown in FIG. 2E.

For example, the thickness of the neutralization film 6 on the protrusions 2a of the structure body 2 is thinner than the thickness of the neutralization film 6 on the recess 2b of the structure body 2.

For example, the neutralization processing may be omitted in the case where the surface energy of the structure body 2 is between the surface energy of the first portions 5A and the surface energy of the second portions 5B.

In the embodiment as recited above, the pattern that has the multiple recesses 1b is formed in the first surface 1a of the patterning member 1 by etching. The patterning member 1 that is etched may be an imprint template. In such a case, for example, the patterning member 1 includes quartz. In the embodiment, the patterning member 1 may include, for example, at least one of a Si film, a C film, or a Cr film. The patterning member 1 may include a stacked film including a Si film, a C film, and a Cr film. The foundation may be patterned using the stacked film as a mask.

The embodiment includes, for example, the following configurations.

Configuration 1

A pattern formation method, including:

forming a structure body on a first surface of a patterning member, the structure body having multiple protrusions and a recess, the multiple protrusions being arranged at a first pitch along a first direction, the first direction being aligned with the first surface, the recess being between the multiple protrusions;

forming a resin film of a block copolymer on the structure body, the block copolymer including multiple first portions and multiple second portions, the multiple first portions and the multiple second portions being arranged alternately at a second pitch along the first direction, the structure body including multiple first regions and multiple second regions, the multiple first portions being on the multiple first regions, the multiple second portions being on the multiple second regions;

removing the multiple second portions and the multiple second regions;

introducing a metal to the remaining multiple first regions; and etching the patterning member using, as a mask, the multiple first regions to which the metal is introduced.

Configuration 2

The pattern formation method according to Configuration 1, wherein the first pitch is an integer multiple of two or more of the second pitch.

Configuration 3

The pattern formation method according to Configuration 2, wherein the height of the multiple protrusions is greater than 0.5 times the second pitch.

Configuration 4

The pattern formation method according to Configuration 3, wherein the thickness of the recess is thicker than 0.5 times the second pitch and thinner than 3 times the second pitch.

Configuration 5

The pattern formation method according to any one of Configurations 1 to 4, wherein one of the multiple protrusions includes a top portion and a bottom portion, the bottom portion is positioned between the top portion and the patterning member, and the width along the first direction of the top portion is finer than the width along the first direction of the bottom portion.

Configuration 6

The pattern formation method according to any one of Configurations 1 to 5, further including forming an neutralization film on the structure body prior to the forming of the resin film, the surface energy of the neutralization film being between the surface energy of the multiple first portions and the surface energy of the multiple second portions.

Configuration 7

The pattern formation method according to any one of Configurations 1 to 6, wherein the structure body is formed by imprinting.

Configuration 8

The pattern formation method according to any one of Configurations 1 to 7, wherein the introducing of the metal includes processing using a metal complex.

Configuration 9

The pattern formation method according to any one of Configurations 1 to 8, wherein the metal includes at least one selected from the group consisting of aluminum, zinc, titanium, and tungsten.

Configuration 10

The pattern formation method according to any one of Configurations 1 to 9, wherein the introducing of the metal includes sequential infiltration synthesis.

Configuration 11

The pattern formation method according to any one of Configurations 1 to 10, wherein the multiple first portions include styrene, and the multiple second portions include acrylic.

Configuration 12

The pattern formation method according to any one of Configurations 1 to 10, wherein the multiple first portions include polystyrene, and the multiple second portions include polymethyl methacrylate.

Configuration 13

The pattern formation method according to any one of Configurations 1 to 12, wherein the structure body includes at least one selected from the group consisting of an acrylic group, a ketone group, and an amino group.

Configuration 14

The pattern formation method according to any one of Configurations 1 to 13, wherein the difference between the surface energy of the structure body and the surface energy of the multiple second portions is smaller than the difference between the surface energy of the multiple second portions and the surface energy of the multiple first portions.

Configuration 15

The pattern formation method according to any one of Configurations 1 to 14, wherein the etched patterning member is an imprint template.

Configuration 16

The pattern formation method according to Configuration 15, wherein the patterning member includes quartz.

Configuration 17

The pattern formation method according to any one of Configurations 1 to 16, wherein
one of the multiple second portions is positioned on one of the multiple protrusions, and
the multiple first portions and the multiple second portions are arranged alternately on the recess.

Configuration 18

The pattern formation method according to any one of Configurations 1 to 17, wherein the second pitch is not less than 10 nm and not more than 100 nm.

Configuration 19

The pattern formation method according to any one of Configurations 1 to 18, wherein the height of the multiple protrusions is 5 nm or more.

Configuration 20

The pattern formation method according to any one of Configurations 1 to 18, wherein the thickness of the recess is not less than 5 nm and not more than 300 nm.

Configuration 21

The pattern formation method according to any one of Configurations 1 to 20, wherein
one of the multiple protrusions includes a top portion and a bottom portion,
the bottom portion is positioned between the top portion and the patterning member, and
the width along the first direction of the recess is wider than the width along the first direction of the top portion.

Configuration 22

The pattern formation method according to any one of Configurations 1 to 20, wherein
one of the multiple protrusions includes a top portion and a bottom portion,
the bottom portion is positioned between the top portion and the patterning member, and
the width along the first direction of the recess is wider than the width along the first direction of the bottom portion.

Configuration 23

The pattern formation method according to any one of Configurations 1 to 20, wherein
one of the multiple protrusions includes a top portion and a bottom portion,
the bottom portion is positioned between the top portion and the patterning member, and
the width along the first direction of the recess is larger than the average of the width along the first direction of the top portion and the width along the first direction of the bottom portion.

According to the embodiments, a pattern formation method can be provided in which high precision is obtained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as structure bodies, and polymers included in body block copolymers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method, comprising:
forming a structure body on a first surface of a patterning member, the structure body having a plurality of protrusions and a recess, the protrusions being arranged at a first pitch along a first direction, the first direction being aligned with the first surface, the recess being between the plurality of protrusions;

forming a resin film of a block copolymer on the structure body, the block copolymer including a plurality of first portions and a plurality of second portions, the first portions and the second portions being arranged alternately at a second pitch along the first direction, the structure body including a plurality of first regions and a plurality of second regions, the first portions being on the plurality of first regions, the second portions being on the plurality of second regions;

removing the second portions and the second regions, such that a part of at least one of the protrusions is removed and another part of the at least one of the protrusions remains;

introducing a metal to the first regions after the removing; and etching the patterning member using the first regions after the introducing, wherein one of the plurality of protrusions includes a top portion and a bottom portion, the bottom portion being positioned between the top portion and the patterning member, a width along the first direction of the top portion being finer than a width along the first direction of the bottom portion.

2. The method according to claim 1, wherein the first pitch is an integer multiple of two or more of the second pitch.

3. The method according to claim 2, wherein a height of the plurality of protrusions is greater than 0.5 times the second pitch.

4. The method according to claim 3, wherein a thickness of the recess is thicker than 0.5 times the second pitch and thinner than 3 times the second pitch.

5. The method according to claim 1, further comprising forming an neutralization film on the structure body prior to the forming of the resin film,
a surface energy of the neutralization film being between a surface energy of the plurality of first portions and a surface energy of the plurality of second portions.

6. The method according to claim 1, wherein the structure body is formed by imprinting.

7. The method according to claim 1, wherein the introducing of the metal includes processing using a metal complex.

8. The method according to claim 1, wherein the metal includes at least one selected from the group consisting of aluminum, zinc, titanium, and tungsten.

9. The method according to claim 1, wherein the introducing of the metal includes sequential infiltration synthesis.

10. The method according to claim 1, wherein
the plurality of first portions includes styrene, and
the plurality of second portions includes acrylic.

11. The method according to claim 1, wherein
the plurality of first portions includes polystyrene, and
the plurality of second portions includes polymethyl methacrylate.

12. The method according to claim 1, wherein the structure body includes at least one selected from the group consisting of an acrylic group, a ketone group, and an amino group.

13. The method according to claim 1, wherein a difference between a surface energy of the structure body and a surface energy of the plurality of second portions is smaller than a difference between the surface energy of the plurality of second portions and a surface energy of the plurality of first portions.

14. The method according to claim 1, wherein the etched patterning member is an imprint template.

15. The method according to claim 14, wherein the patterning member includes quartz.

16. The method according to claim 1, wherein
one of the plurality of second portions is positioned on one of the plurality of protrusions, and
the plurality of first portions and the plurality of second portions are arranged alternately on the recess.

17. A pattern formation
method, comprising:
forming a structure body on a first surface of a patterning member, the structure body having a plurality of protrusions and a recess, the protrusions being arranged at a first pitch along a first direction, the first direction being aligned with the first surface, the recess being between the plurality of protrusions;

forming a resin film of a block copolymer on the structure body, the block copolymer including a plurality of first portions and a plurality of second portions, the first portions and the second portions being arranged alternately at a second pitch along the first direction, the structure body including a plurality of first regions and a plurality of second regions, the first portions being on the plurality of first regions, the second portions being on the plurality of second regions;

removing the second portions and the second regions, such that a part of at least one of the protrusions is removed and another part of the at least one of the protrusions remains;

introducing a metal to the first regions after the removing; and etching the patterning member using the first regions after the introducing, wherein
one of the plurality of protrusions includes a top portion and a bottom portion,
the bottom portion is positioned between the top portion and the patterning member, and
a width along the first direction of the recess is wider than a width along the first direction of the top portion.

18. A pattern formation
method, comprising:
forming a structure body on a first surface of a patterning member, the structure body having a plurality of protrusions and a recess, the protrusions being arranged at a first pitch along a first direction, the first direction being aligned with the first surface, the recess being between the plurality of protrusions;

forming a resin film of a block copolymer on the structure body, the block copolymer including a plurality of first portions and a plurality of second portions, the first portions and the second portions being arranged alternately at a second pitch along the first direction, the structure body including a plurality of first regions and a plurality of second regions, the first portions being on the plurality of first regions, the second portions being on the plurality of second regions;

removing the second portions and the second regions, such that a part of at least one of the protrusions is removed and another part of the at least one of the protrusions remains;

introducing a metal to the first regions after the removing; and etching the patterning member using the first regions after the introducing, wherein
one of the plurality of protrusions includes a top portion and a bottom portion,
the bottom portion is positioned between the top portion and the patterning member, and
a width along the first direction of the recess is wider than a width along the first direction of the bottom portion.

19. A pattern formation method, comprising:

forming a structure body on a first surface of a patterning member, the structure body having a plurality of protrusions and a recess, the protrusions being arranged at a first pitch along a first direction, the first direction being aligned with the first surface, the recess being between the plurality of protrusions;

forming a resin film of a block copolymer on the structure body, the block copolymer including a plurality of first portions and a plurality of second portions, the first portions and the second portions being arranged alternately at a second pitch along the first direction, the structure body including a plurality of first regions and a plurality of second regions, the first portions being on the plurality of first regions, the second portions being on the plurality of second regions;

removing the second portions and the second regions, such that a part of at least one of the protrusions is removed and another part of the at least one of the protrusions remains;

introducing a metal to the first regions after the removing; and etching the patterning member using the first regions after the introducing, wherein
one of the plurality of protrusions includes a top portion and a bottom portion,
the bottom portion is positioned between the top portion and the patterning member, and
a width along the first direction of the recess is larger than the average of a width along the first direction of the top portion and a width along the first direction of the bottom portion.

* * * * *